US006603683B2

(12) United States Patent
Hsu et al.

(10) Patent No.: US 6,603,683 B2
(45) Date of Patent: Aug. 5, 2003

(54) DECODING SCHEME FOR A STACKED BANK ARCHITECTURE (75) Inventors: Louis Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/888,774

(22) Filed: Jun. 25, 2001

(65) Prior Publication Data

US 2002/0196669 A1 Dec. 26, 2002

(51) Int. Cl.[7] .............................. G11C 7/00; G11C 8/00
(52) U.S. Cl. ........................ 365/189.04; 365/230.03; 365/230.06
(58) Field of Search ..................... 365/189.07, 230.03, 365/230.06

(56) References Cited

U.S. PATENT DOCUMENTS

| | | | | |
|---|---|---|---|---|
| 5,557,766 A | * | 9/1996 | Takiguchi et al. | 710/260 |
| 5,652,861 A | * | 7/1997 | Mayo et al. | 711/157 |
| 6,078,542 A | * | 6/2000 | Tomishima | 365/196 |
| 6,185,629 B1 | * | 2/2001 | Simpson et al. | 710/10 |
| 6,272,567 B1 | * | 8/2001 | Pal et al. | 710/2 |
| 6,351,427 B1 | * | 2/2002 | Brown | 365/189.05 |
| 6,359,808 B1 | * | 3/2002 | Chen et al. | 365/185.21 |
| 6,373,753 B1 | * | 4/2002 | Proebsting | 365/189.09 |
| 6,396,744 B1 | * | 5/2002 | Wong | 365/185.22 |
| 6,397,314 B1 | * | 5/2002 | Estakhri et al. | 365/189.04 |

* cited by examiner

*Primary Examiner*—Hoai Ho
*Assistant Examiner*—Ly Duy Pham
(74) *Attorney, Agent, or Firm*—McGuireWoods LLP; Joseph P. Abate (57) ABSTRACT A decoding scheme for simultaneously executing multiple operations for a stacked-bank type semiconductor memory device is disclosed. A decoding unit is provided to a memory bank group comprising a plurality of memory banks. When read and write bank addresses match with two different memory banks within the same memory bank group, the decoding unit receives the read and write addresses and generates two different row selection signals for the read and write operations in two different banks. Based on the row selection signals, the row decoder unit in the two matching banks simultaneously activates a target row designated by the read/write addresses.

25 Claims, 8 Drawing Sheets

Related Art

DECODING SCHEME FOR A STACKED BANK ARCHITECTURE

BACKGROUND OF THE INVENTION

1. Field of the Invention

The present invention generally relates to a semiconductor memory architecture and, more particularly, to an address decoding scheme for a stacked-bank memory architecture.

2. Background Description

There is an ever increasing need for access speed and throughput in a memory device to meet the demands of ever faster generations of processors. One common type of memory device used with processors is a dynamic random access memory (DRAM). DRAMs comprise an array of individual memory cells. The memory array consists of a multitude of rows and columns, where the intersection of each row and column defines a memory cell location address. Typically, each DRAM memory cell comprises a capacitor for holding a charge and an access transistor for accessing the capacitor for altering or sensing the charge. The charge is representative of a data bit and can be either high voltage or low voltage (representing, e.g., a logical "1" or a logical "0", respectively). Data can be stored in memory during write operations or read from memory during read operations.

The capacitor is charged while data is written into DRAM in a write operation, and the amount of charge stored in the capacitor is sensed to estimate the logic states of the memory cells while data is read from memory cells in a subsequent read cycle. However, capacitors are subject to charge leakage and a typical DRAM needs so-called refresh operation cycles, during which the DRAM can replace charge in accordance with stored data.

Refresh, read, and write operations in conventional DRAMs are typically performed for all cells in one row simultaneously. Data is read from a memory cell by activating a row, referred to as a word line, which couples all memory cells corresponding to that row to digit or bit lines which define the columns of the array. When a particular word line is activated, sense amplifiers detect and amplify the data present on an active bit/column line. In order to access a memory cell in the memory array, the DRAM operating system selects the particular row and column corresponding to that bit, and the sense amplifier determines whether a "1" or a "0" has been stored in the memory location.

In order to improve access speed and cycle time of a DRAM, a proposal was made to reduce a memory array size; a so called "micro-cell architecture". The goal of this approach is to significantly reduce the length of each word line and the number of word lines per each memory cell array to reduce the capacitance load presented thereby. To achieve this goal, it has been widely adopted to arrange the memory cells of a DRAM into operative units, also referred to as "banks" to form "a multi-bank structure". Conventionally, a DRAM chip for a stand alone or embedded DRAM design may comprise two to sixteen banks. Some memories are capable of simultaneously accessing four banks for a read, write or refresh operation.

Figure 1:
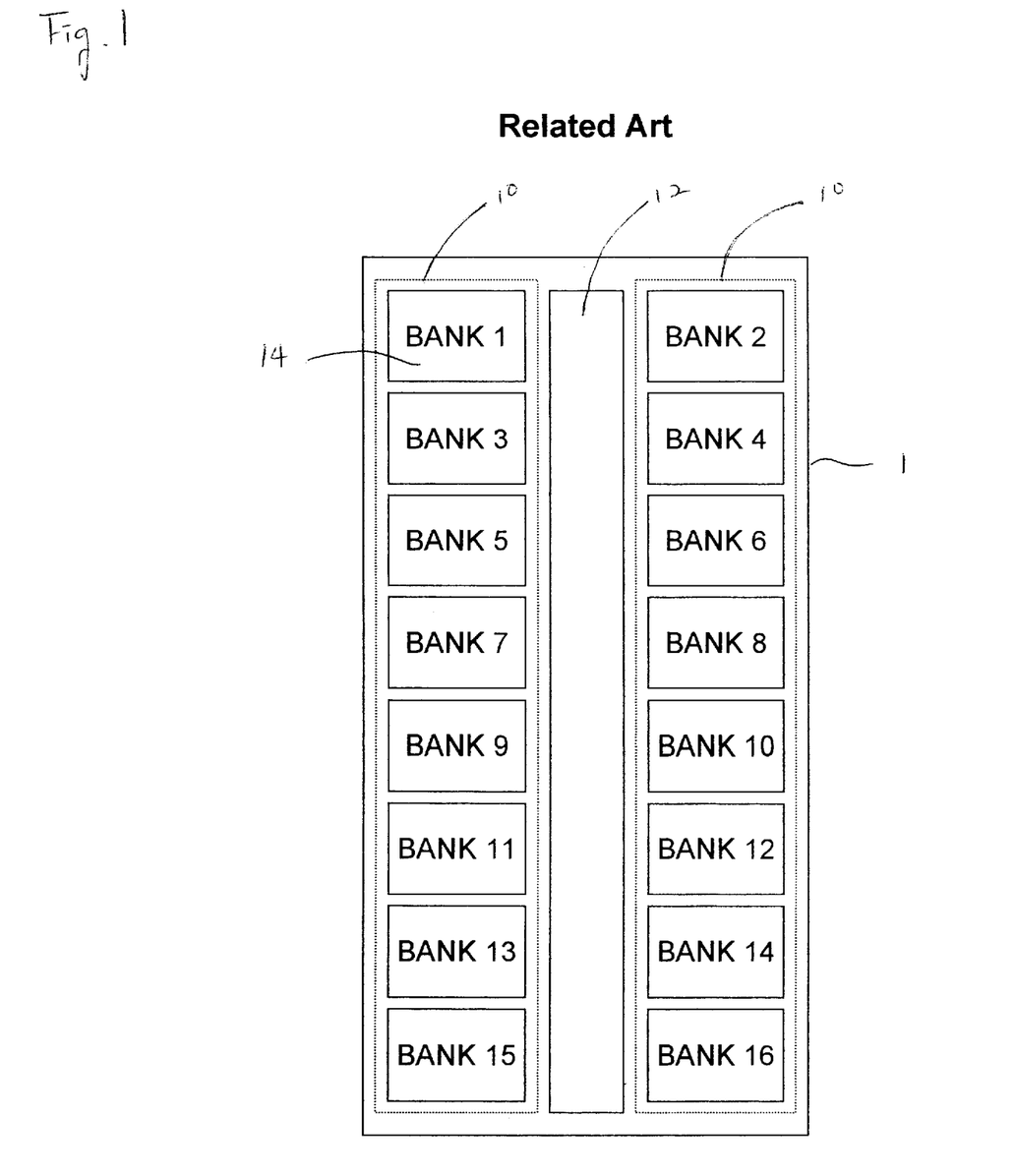
FIG. 1 depicts a conventional multi-bank type DRAM device, in which a plurality of banks are arranged along the sides of a spine region, but no bank is stacked on another.

An example of this type of architecture in shown in FIG. 1, which illustrates a schematic diagram of a semiconductor memory chip 1 divided into two memory array blocks 10 and a spine area 12.

Figure 2:
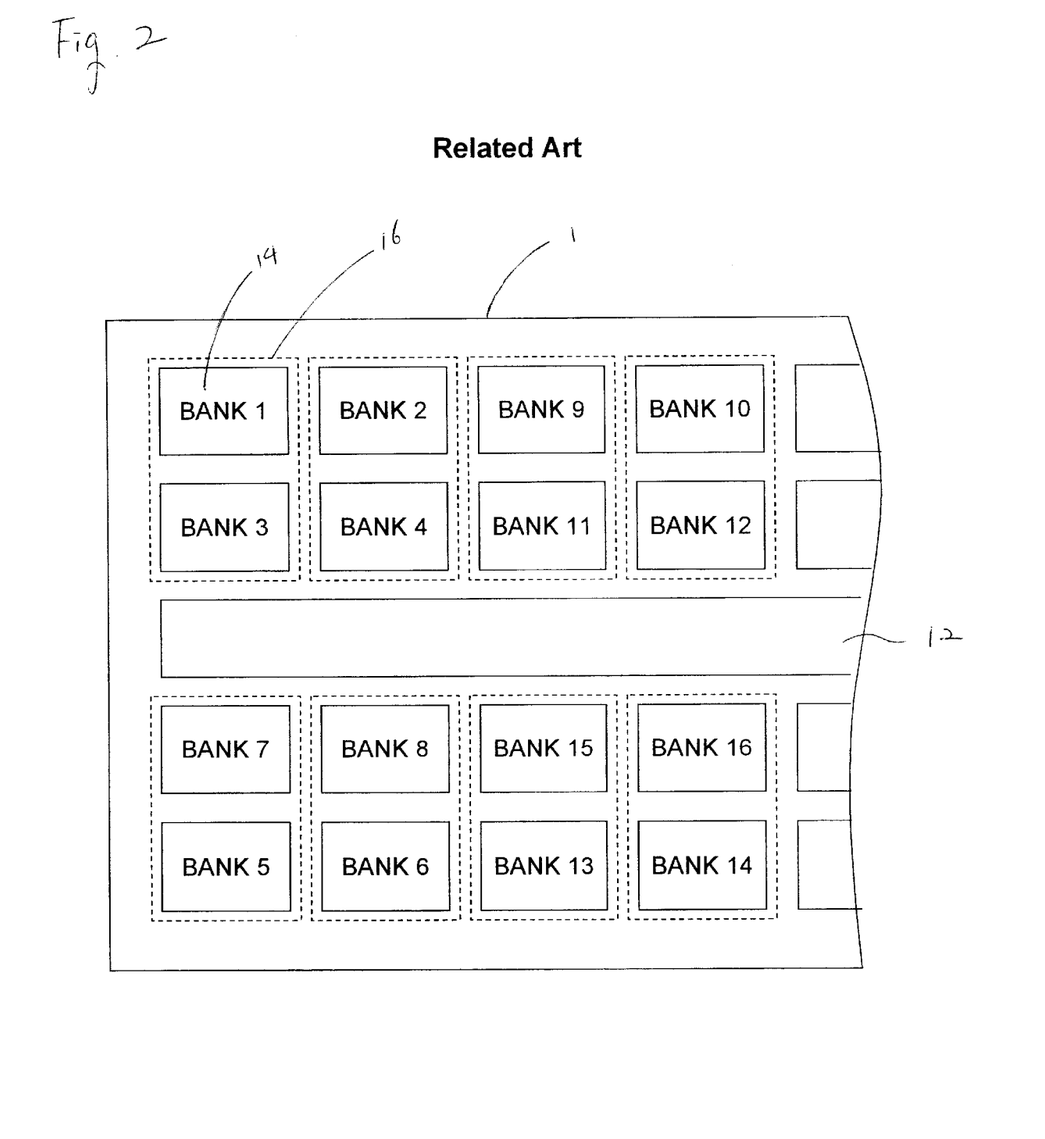
FIG. 2 depicts a conventional multi-bank type DRAM device, in which a plurality of banks are arranged in a stacked-bank architecture.

It is to be understood that FIGS. 1 and 2 are largely generic, highly schematic and arranged to facilitate an understanding of the problems addressed by the invention. Therefore, while FIGS. 1 and 2 do not explicitly illustrate the invention, no portion FIG. 1 or 2 is admitted to be prior art in regard to the present invention. Accordingly, FIGS. 1 and 2 have been designated as "Related Art".

In FIG. 1, a main address bus or a global address bus is normally arranged within the spine area 12 and transfers memory cell addresses and data for read/write/refresh operations in each bank. In FIG. 1, each memory array block 10 is divided into eight banks. The odd number memory banks (banks 1, 3, 5, 7, 9, 11, 13 and 15) are arranged in the memory array block 10 on the left of the spine area 12, and the even number memory banks (bank 2, 4, 6, 8, 10, 12, 14 and 16) are arranged in the memory array block 10 on the right of the spine area 12.

Word lines of a multi-bank structure are required to traverse only the bit line pairs confined within one bank, instead of the entire bit line pairs within the chip 1. Therefore, the length and capacitance of the word lines are significantly reduced. Also, the memory array blocks 10 are not only divided in the column direction (left and right memory array blocks) but also the row direction (eight banks in each memory array block 10), and the number, length and capacitance of the word lines and bit lines in each bank is thus also reduced.

Another goal of a modem DRAM design is to increase the device density as much as possible. It is conventionally possible to design a memory chip with a high array efficiency so that the area ratio between the area occupied by the memory cells and the total chip space is in the range between 55% to 70%. The "high-density" devices, however, suffer speed penalty because of the heavy loading of word lines and bit lines.

In a micro-cell design, the loading of word lines can be reduced to about one sixteenth of that of the conventional word lines, and the loading of bit lines can be reduced to about one fourth of that of the conventional bit lines, by reducing the memory array size. Therefore, the access time and cycle time of the micro-cell type DRAM can be as short as 3 nanoseconds to 6 nanoseconds with a cycle time potentially as short as 10 nanoseconds while the access time of the word line and bit line of the high-density devices are from 10 nanoseconds to 30 nanoseconds. However, to further divide the array to reduce the word line length and number as described above, the array efficiency of the micro-cell DRAM is less satisfactory as compared to the high-density devices, and is in the range of 45% to 55%.

To improve the array efficiency of the micro-cell architecture, a "stacked-bank architecture" has been proposed, in which at least one bank is stacked on the top of another bank. FIG. 2 depicts a multi-bank semiconductor memory device 1 having a plurality of banks 14 arranged in a multi-bank structure, in which bank 1, bank 2, bank 9 and bank 10 are stacked on bank 3, bank 4, bank 11 and bank 12, respectively. Also, bank 5, bank 6, bank 13 and bank 14 are stacked on bank 7, bank 8, bank 15 and bank 16, respectively. In other words, in a stacked-bank structure, one bank (i.e., bank 3) is arranged between another bank (i.e., bank 1) and the spine area 12 which includes a global address bus and data bus.

However, in general, a stacked-bank architecture has been avoided because of difficulty in designing a decoding scheme. Particularly, since one bank (e.g., bank 1) is blocked from the spine area 12 by another bank (e.g., bank 3), it has not been possible to access both of the stacked banks (e.g., bank 1 and bank 3) simultaneously for different operations. For example, when memory cell addresses transferred from the main memory bus indicates a read operation in bank 1 and a write operation in bank 3, first a bank address for the read operation is transferred to both bank 1 and bank 3. Based on the bank address, bank 1 is activated for the read operation while bank 3 is not activated until bank 1 completes the read operation. Upon completing the read operation in bank 1, another bank address for the write operation is transferred to both of bank 1 and bank 3. The matching bank 3 is then activated for the write operation while bank 1 is not activated. Thus, although a stacked-bank architecture provides an improved array efficiency and cycle time, due to the difficulty in designing an efficient decoding scheme, a stacked-bank architecture has not provided flexibility of operation in a single cycle, and the full potential response speed has not been achieved.

On the contrary, application of a micro-cell design to larger memories results in the number of banks (i.e., 1024 banks) being drastically increased, as is the likelihood of a need to write and read cells of different banks of a common stack; compromising the potential response speed of micro-cell designs. Therefore, it is seen that while many developments having the potential to improve memory performance have been developed, on an operation level, various practical trade-offs have prevented such potential improvement from being fully realized in practical memory applications.

SUMMARY OF THE INVENTION

It is therefore an objective of the present invention to provide a multi-bank decoding scheme for simultaneously executing multiple operations in a semiconductor memory device having a stacked-bank architecture.

Another object of the present invention is to provide an improved decoding scheme which enables simultaneous execution of read, write or refresh operations on at least two banks arranged in a stacked-bank architecture.

A further object of the present invention is to provide a decoding scheme which enables simultaneous execution of multiple operations on at least two different banks arranged in two different stacks.

A further object of the present invention is to provide a decoding unit which translates bank addresses and read/write addresses from an address bus to local row addresses for read/write/refresh operations.

A further object of the present invention is to provide a refresh operation scheme for a semiconductor memory device, in which more than two can be simultaneously refreshed.

Additional objectives and other features of the present invention will be set forth in part in the description which follows and will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor memory device comprising a plurality of memory bank groups. Each memory bank group comprises a plurality of memory banks arranged in a stacked-bank architecture. An address bus is provided for transferring read/write bank addresses and read/write addresses for read/write operations. Each memory bank group simultaneously executes read/write operations on at least two memory banks thereof.

Thus, according to the present invention, at least two banks within the same memory bank group can be simultaneously accessed for read/write operations. Since even two different memory banks stacked with each other can be accessed simultaneously for different operations, the present invention significantly reduces operation response time.

Another aspect of the present invention is a semiconductor memory device comprising a plurality of memory bank group, each group comprising a plurality of memory banks arranged in a stacked-bank architecture. An address bus is provided for transferring read/write bank addresses and read/write addresses for read/write/refresh operations. Each memory bank group simultaneously executes said read/write/refresh operations at least two memory banks thereof.

Accordingly, according to the present invention, at least different two banks within the same memory bank group, especially at least two different banks constituting a stack can be simultaneously accessed for read, write or refresh operations. Thus, access time for executing operations of different types can be significantly reduced.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention provides a decoding scheme for a semiconductor memory device having a stacked-bank structure. As previously mentioned, one of the problems that accompanies a conventional multi-bank memory device is that it is not possible to simultaneously execute multiple operations (e.g., read, write and refresh operations) on the memory banks stacked with each other in a common stack during a single memory operation cycle. For this reason, a stacked-bank architecture has been rarely considered as a feasible solution for a micro-cell architecture since the memory cell array must be more finely subdivided to reduce word line and bit line capacitance loading.

According to the present invention, a decoding scheme for a stacked-bank architecture is achieved to enable simultaneous execution of multiple operations on memory banks stacked with each other. Thus, the present invention increases operation speed by executing two or more operations simultaneously in a micro-cell design allowing reduced cycle time and improves array efficiency by arranging the memory banks in a stacked-bank architecture.

Figure 3:
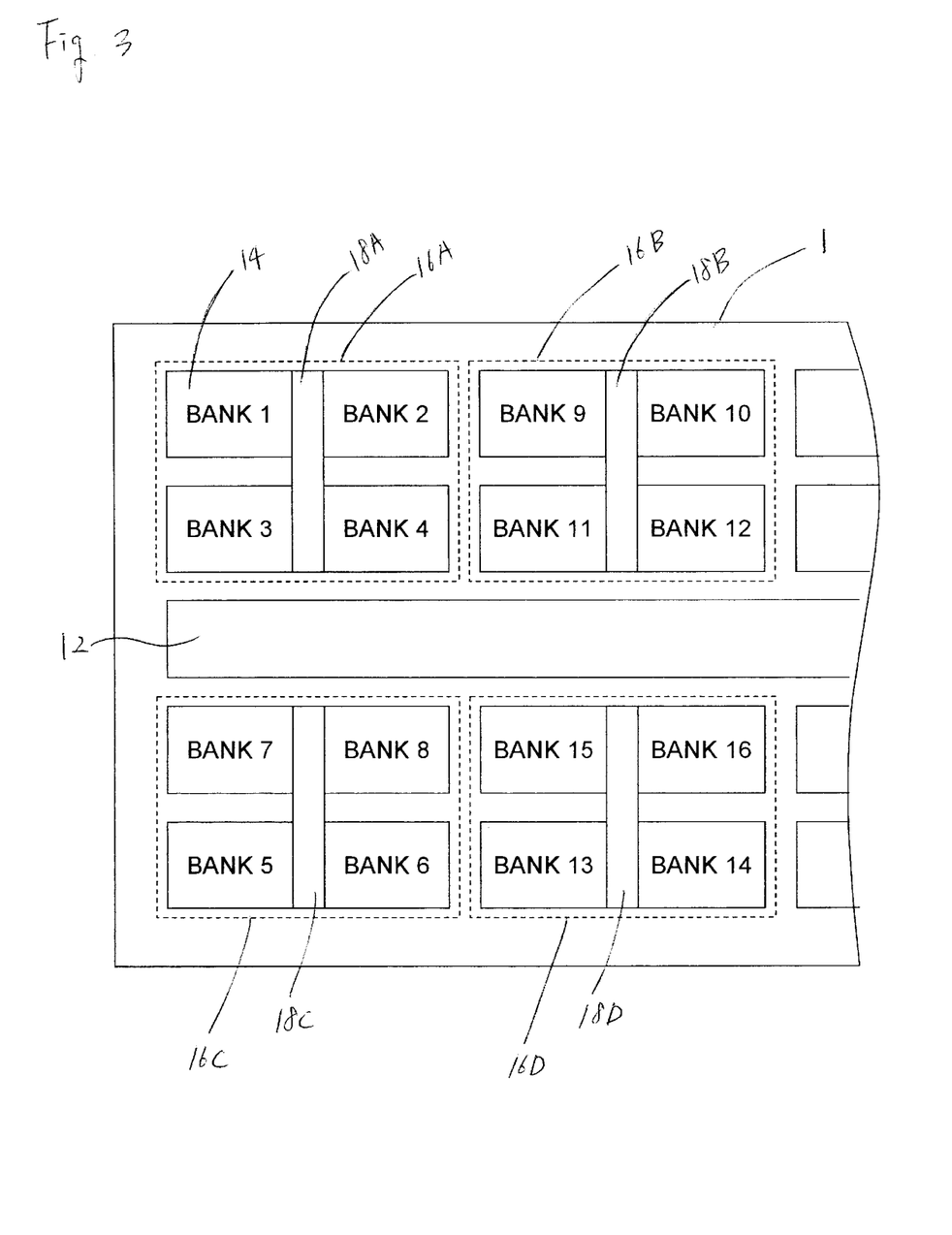
FIG. 3 depicts a multi-bank type DRAM device, in which a plurality of memory banks are arranged in a stacked-bank architecture and grouped into a plurality of memory bank groups, and a plurality of decoding units are provided corresponding to the plurality of memory banks, according to an embodiment of the present invention.

With this concept in mind, FIG. 3 depicts a plurality of memory banks 14 are arranged on a surface of a semiconductor memory chip 1 (e.g., DRAM, SRAM, flash memory or embedded memory array). Similar to FIG. 2, the memory banks 14 shown in FIG. 3 are arranged in a stacked-bank structure in the semiconductor memory chip 1, in which bank 1, bank 2, bank 9 and bank 10 are stacked on bank 3, bank 4, bank 11 and bank 12, respectively. Also, bank 5, bank 6, bank 13 and bank 14 are stacked on bank 7, bank 8, bank 15 and bank 16, respectively.

According to the present invention, the plurality of memory banks are grouped into a plurality of memory bank groups, and each memory bank group is enabled to simultaneously execute multiple operations on its different memory banks. The grouping of the memory bank is very flexible and can be determined by considering the word line length and the load thereby applied to the word lines of each bank. For example, FIG. 3 exemplarily depicts the memory banks 1–16 grouped into four memory bank groups 16A, 16B, 16C and 16D based on their proximity. Thus, the memory banks 1 to bank 4 are grouped as the memory bank group 16A. The memory bank group 16A has two stacks of the memory banks, of which bank 1 and bank 3 constitute the first stack and bank 2 and bank 4 constitute the second stack.

Figure 4:
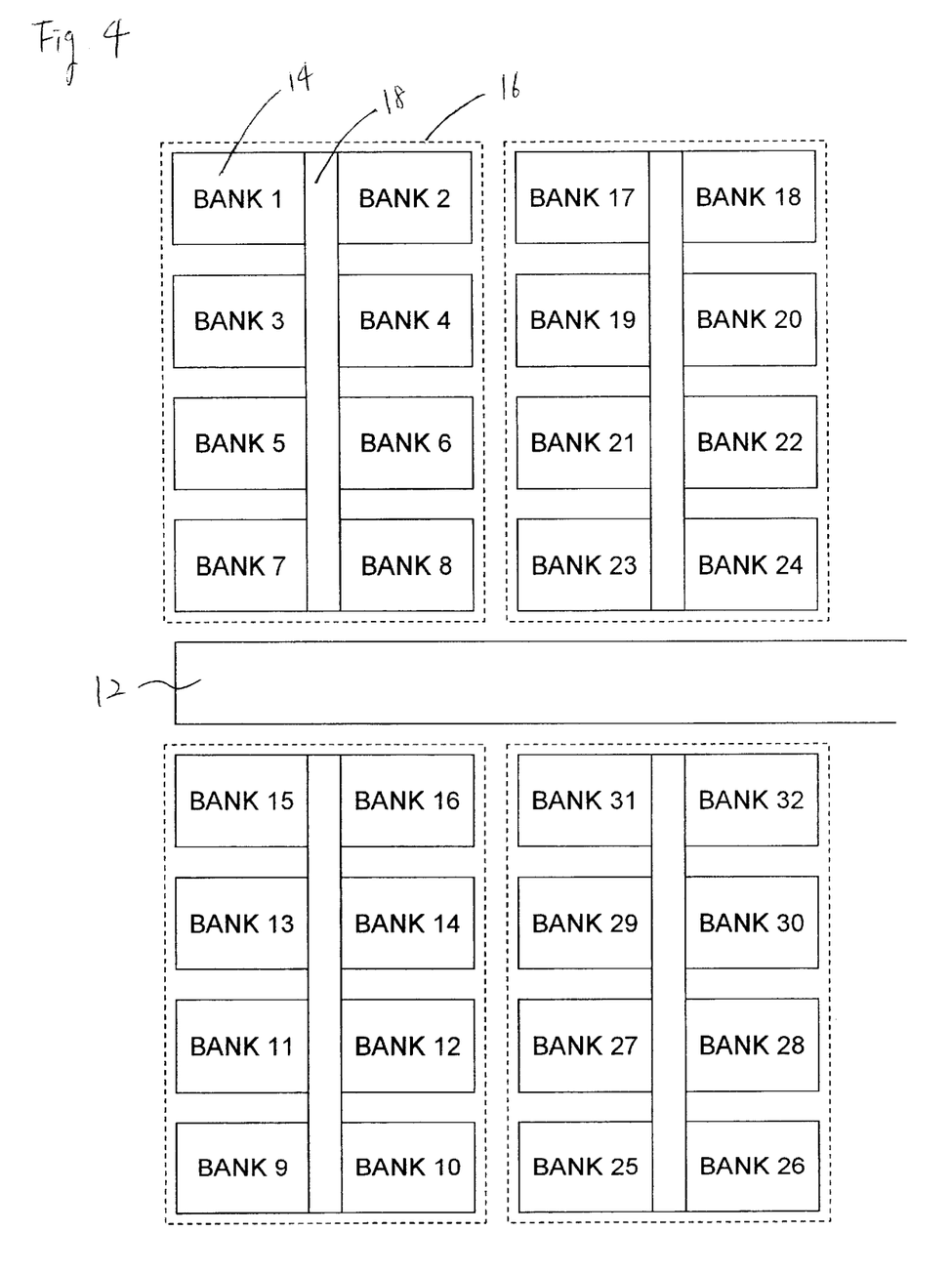
FIG. 4 depicts a multi-bank type DRAM device similar to that of FIG. 3, in which each memory bank group having two memory bank stacks, and each memory bank stack comprising four memory banks, according to an embodiment of the present invention.

The grouping of the memory banks 14, however, is not limited to the specific embodiment shown herein. Rather, at least two memory banks can be grouped as a memory bank group as long as they constitute a stack (e.g., bank 1 and bank 3). For example, FIG. 4 depicts a memory bank group 16 including eight memory banks, of which banks 1, bank 3, bank 5 and bank 7 constitute the first stack, and banks 2, bank 4, bank 6 and bank 8 constitute the second stack.

To achieve simultaneous execution of multiple operations, the memory bank group 16A, 16B, 16C and 16D are provided with a decoding unit 18A, 18B, 18C and 18D, respectively, as shown in FIG. 3. The memory bank group 16A is provided with the decoding unit 18A, which enables its corresponding memory bank 16A to execute read and write operations simultaneously on at least two different memory banks. For example, while a read operation is executed in the bank 1, a write operation can be simultaneously executed in the bank 3. If the bank 2 is selected for a read operation, any one of bank 1, bank 3 or bank 4 can be selected for a write operation. Thus, according to the present invention, not only two memory banks constituting a stack but also two memory stacks arranged in the adjacent stacks can be selected for simultaneous execution of the multiple operations.

Figure 5:
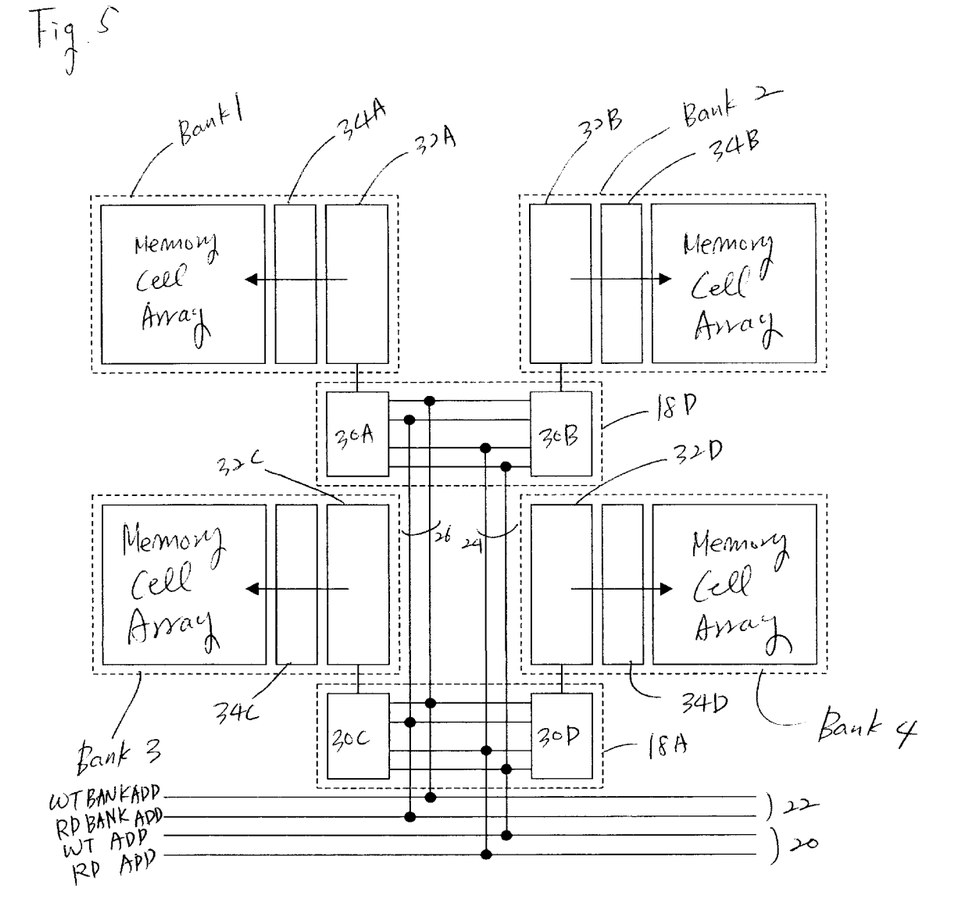
FIG. 5 depicts a schematic diagram of a memory bank group and a decoding unit for simultaneous execution of multiple operations, in accordance with an embodiment of the present invention.

FIG. 5 depicts the decoding scheme for simultaneous execution of multiple operations within a memory bank group. FIG. 5 particularly shows the memory bank group 16A of FIG. 3, which includes the memory banks 1–4. Each memory bank includes memory array, a row decoder block (i.e., 32A, 32B, 32C and 32D) and a word line driver unit (i.e., 34A, 34B, 34C and 34D). The decoding unit 18A includes four register units 30A, 30B, 30C and 30D, which are provided corresponding to the memory banks 1 to 4 of the memory bank group 16A, respectively. The register units 30A, 30B, 30C and 30D are connected to a global read/write bank address bus 22 and a global row address bus 20 via a local read/write bank address bus 26 and a local read/write row address bus 24 and a local read/write bank address bus 26, respectively.

The global read/write bank address bus 22 transfers a write bank address WT BANK ADD indicating a bank containing a memory cell in which the writing operation is to be executed, and a read bank address RD BANK ADD indicating a bank containing a memory cell in which the read operation is to be executed. The global read/write row address bus 20 transfers a write row address WT ADD representing the row address of a memory cell within the bank designated by the write bank address WT BANK ADD, and a read row address RD ADD representing the row address of a memory cell within the bank designated by the read bank address RD BANK ADD.

The operation of the decoding unit 18A will be now described hereafter. When two memory cells located in two different memory banks of the same memory bank group are selected for read and write operations, respectively, by a micro processor unit (MPU), a read bank address and a write bank address are transferred via the global read/write bank address bus 22 and the local read/write bank address bus 20 to the decoding unit 18A. A read row address and a write row address are transferred via the global read/write row address bus 20 and the local read/write row address bus 24 to the decoding unit 18A.

Although it is not necessary, the global read/write row address bus 20 and the local read/write address bus 24 are preferably configured to simultaneously transfer a read row address and a write row address when read and write operations are issued by a micro processor unit (MPU). This enables improving the data processing rate, thereby increasing the chip speed and performance.

The register units 30A, 30B, 30C and 30D of the decoding unit 18A determine whether either the read bank address RD BANK ADD or the write bank address WT BANK ADD matches its corresponding memory bank. For example, the register unit 30A determines whether the read or write bank address RD BANK ADD, WT BANK ADD matches its corresponding memory bank 1. If neither of the read/write bank address RD BANK ADD, WT BANK ADD matches memory bank 1, the decoding unit 30A recognizes that neither of the read or write operation is to be performed within the memory bank 1. If one of the read and write bank addresses RD BANK ADD, WT BANK ADD matches with memory bank 1, the decoding unit 30A takes in one of the read row address RD ADD or the write row addresses WT ADD, and generates and transfers a row selection signal to the row decoder block 32A of the bank 1. Based on the row selection signal from the decoding unit 3 OA, the row decoder block 32A selectively activates one of the word line drivers in the word line driver unit 34A to selectively activate a row containing the operation target memory cell.

Since the read/write bank addresses and the read/write addresses are simultaneously provided to each of the decoding units 30A, 30B, 30C and 30D, a different operation can be simultaneously executed in any of the rest memory banks 2–4. For example, if the read bank address matches with the bank 1, and the write bank address matches with the bank 3, the read address and the write address are simultaneously provided to the decoding units 30A and 30C, respectively. The decoding units 30A and 30C simultaneously provide the row selection signals to their corresponding row decoder block 32A and 32C, respectively. Based on the row selections signals, the read and write operations are simultaneously executed in the memory banks 1 and 3.

Figure 6:
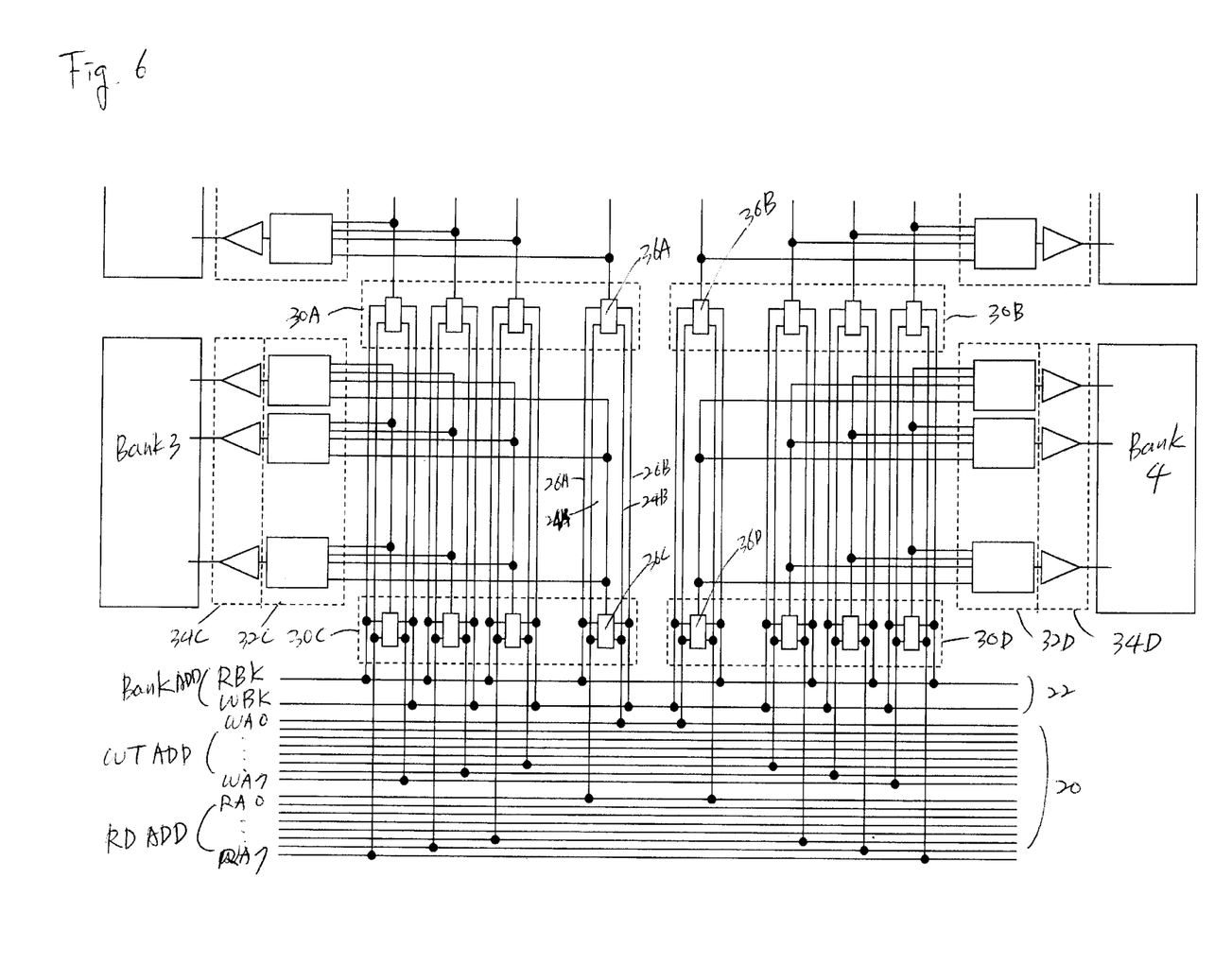
FIG. 6 depicts a detailed schematic diagram of FIG. 5, in which the decoding unit comprises four register units and each register unit comprises a plurality of multiplexing units, in accordance with an embodiment of the present invention.

The more detailed illustration of the decoding unit 18A and the decoding scheme are depicted in FIG. 6. Assuming that each memory bank has 256 rows (i.e., word lines), the global read/write row address bus 20 includes eight read row address bus lines and eight write row address lines through which an eight-bit read row address and an eight-bit write row address are transferred. Since there are four banks in the memory bank group 16A, the global read/write bank address bus 22 includes two read bank address lines and two write bank address lines and a two-bit read bank address RBK and a two-bit write bank address WBK are transferred.

In the case the read bank address matches with the bank 3, the register unit 30C generates an eight-bit row selection signal so that the row decoder block 32C determines which one of 256 word lines should be activated for the read or write operation. The eight-bit row selection signal is generated by eight multiplexing units 36C within the register unit 30C. Each multiplexing unit 36C is configured to receive the read/write bank addresses and the read/write row address from the global read/write bank address bus 22 and the global read/write row address bus 20 via a local read bank address bus 26A, a local write bank address bus 26b, a local read row address bus 24a and a local write row address bus 24b.

The multiplexing unit 36C are configured to received different bits of the read row address RD ADD. For example, the multiplexing unit arranged at the most left is connected to one of the global read row address bus lines transferring the most significant bit of the read row address RD ADD while the one at the most right is connected to another bus line transferring the least significant bit. Based on the different bits of the read row address RD ADD, each of the multiplexing unit 36C generates a binary output signal, of which the combination with other binary output signals from other multiplexing units constitutes the row selection signal. The row selection signal is provided to row decoders 32C0–32C255 of the row decoder unit 32C, which activates one of 256 word line drivers 34C0–34C255 within the word line driver unit 34C.

While the bank 3 is executing the read operation, any of the remaining banks 1, 2 and 4 can simultaneously execute the write operation because the writing bank address and write row address can be transferred via the local address bus to any of the remaining banks without causing any signal conflict with the read operation within the bank 3. Thus, the present invention enables simultaneous execution of the read/write operation in two different memory banks of the same memory bank group.

Figure 7:
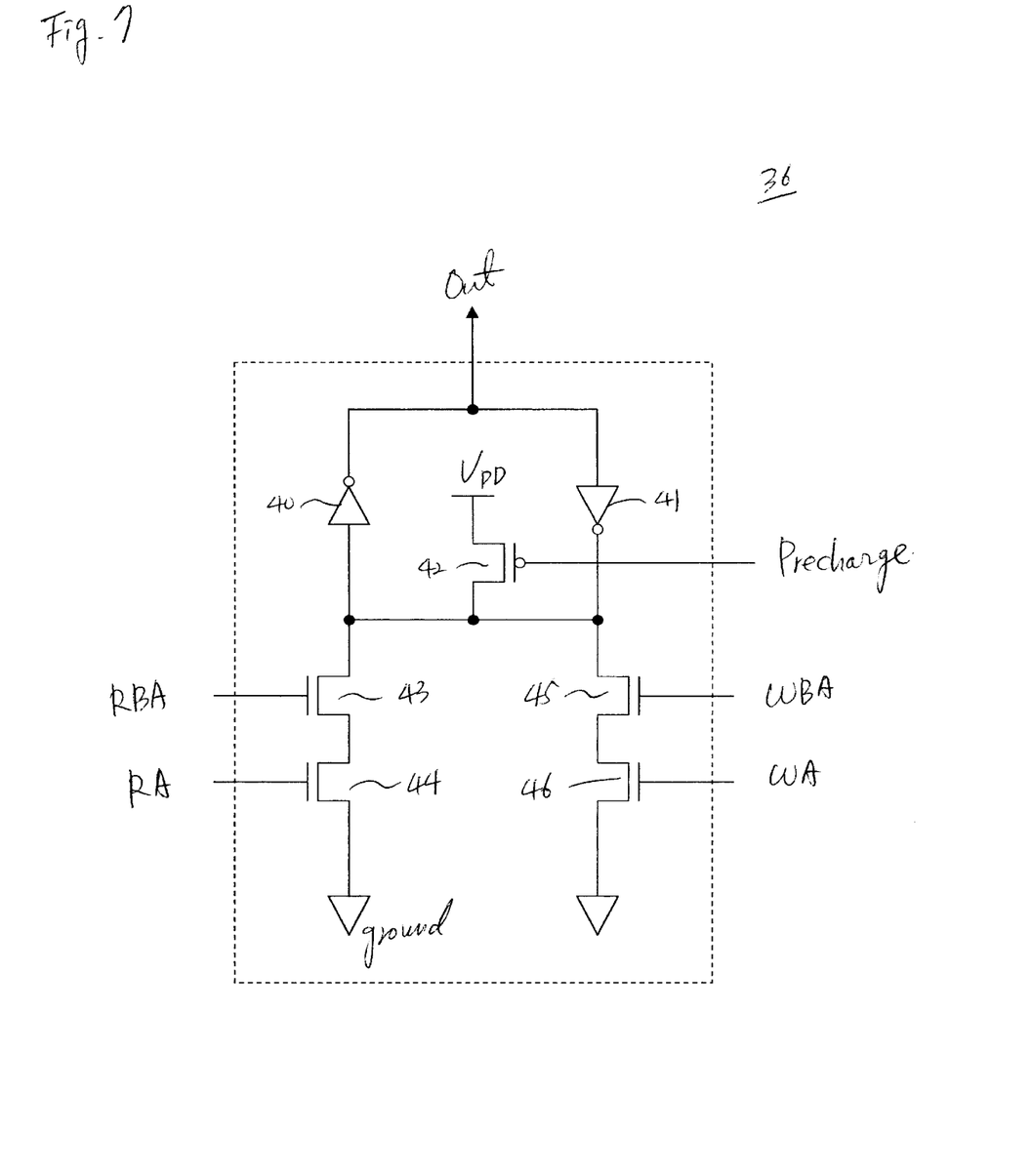
FIG. 7 depicts a circuit diagram of the multiplexing unit of FIG. 6, in accordance with an embodiment of the present invention.

FIG. 7 depicts a circuit diagram of the multiplexing unit 36. The multiplexing unit 36 have a latch formed by a pair of back-to-back inverters 40, 41, a first decoding path comprising two NMOS transistors 43, 44 connected in series and a second decoding means path comprising two NMOS transistors 45, 46 connected in series, and a precharging means comprising a precharge voltage source VDD and a PMOS transistor 42. An output node is formed at a node between the output terminal of the inverter 40 and the input terminal of the inverter 41. The precharge voltage source VDD is connected to the node between the output terminal of the inverter 41 and the input terminal of the inverter 40 via the PMOS transistor 42.

The first decoding path is coupled between a ground node and a node between the input terminal of the inverter 40 and the node to which the precharge voltage source is connected. The second decoding path is coupled between the ground node and a node between the output terminal of the inverter 41 and the node to which the precharge voltage source is connected.

The control gates of the NMOS transistors 43, 44 of the first decoding path are connected to the local read bank address bus 26A and the local read row address bus 24A in FIG. 6. The control gates of the NMOS transistors 45, 46 are connected to the local write bank address bu 26B and the local write row address bus 26A. The control gate of the PMOS transistor 42 is connected to a precharge signal line.

The operation of the multiplexing unit 36 will be describe hereafter. Before starting a decoding process, the PMOS transistor 42 is fully turned on by the precharge signal applied to the control gate of the PMOS transistor 42, in order to charge the node between the output terminal of the inverter 41 and the input terminal of the inverter 40 to the VDD level. The charge is latched in the node between the output terminal of the inverter 41 and the input terminal of the inverter 40 until the inverter 40 is activated by a clock signal (not shown). Once the inverter 40 is activated the charged latched is inverted and a "low" is generated to the output node of the multiplexing unit 36.

Since the NMOS transistors 43, 44 are connected in series, the voltage precharged within the latch would be discharged to the ground only when both of the NMOS transistors 43, 44 are turned on. The discharged value is inverted by the inverter 40 and a "high" level is generated from the output node.

Once the latched VDD charge is discharged via the NMOS transistors 43, 44, a "low" is latched in the node between the output terminal of the inverter 41 and the input terminal of the inverter 40. In the subsequent clock cycle, the "low" is inverted by the inverter 40 and a "high" is outputted from the output node OUT of the multiplexing unit 36. Thus, only when the particular bits of the read bank address and read row address provided to the multiplexer unit 36 are both in "high", the same "high" is outputted from the output node.

Similarly, the second decoding path constitutes a discharge path only when both of the NMOS transistors 45, 46 are turned on. Thus, only when the particular bits of the write bank address and write row address provided to the multiplexer unit 36 are both in "high", both of the NMOS transistors 45, and 46 are turned on and the charge latched in the node between the output terminal of the inverter 41 and the input terminal of the inverter 40 would be discharged to the ground.

The eight-bit row selection signal from the eight multiplexing units 36C in the register unit 30C is transferred to the row decoder unit 32C which is connected to the word line driver unit 34C. Since the memory bank 3 has 256 rows (e.g., word lines), the row decoder unit 32C is provided with 256 row decoders 32C0 to 32C255, and the word line driver unit 34C is provided with 256 word lines drivers 34C0 to 34C255. Each word line driver is coupled between its corresponding row decoder and word line and selectively activates its corresponding word line based on the decoding result by its corresponding row decoder.

Figure 8:
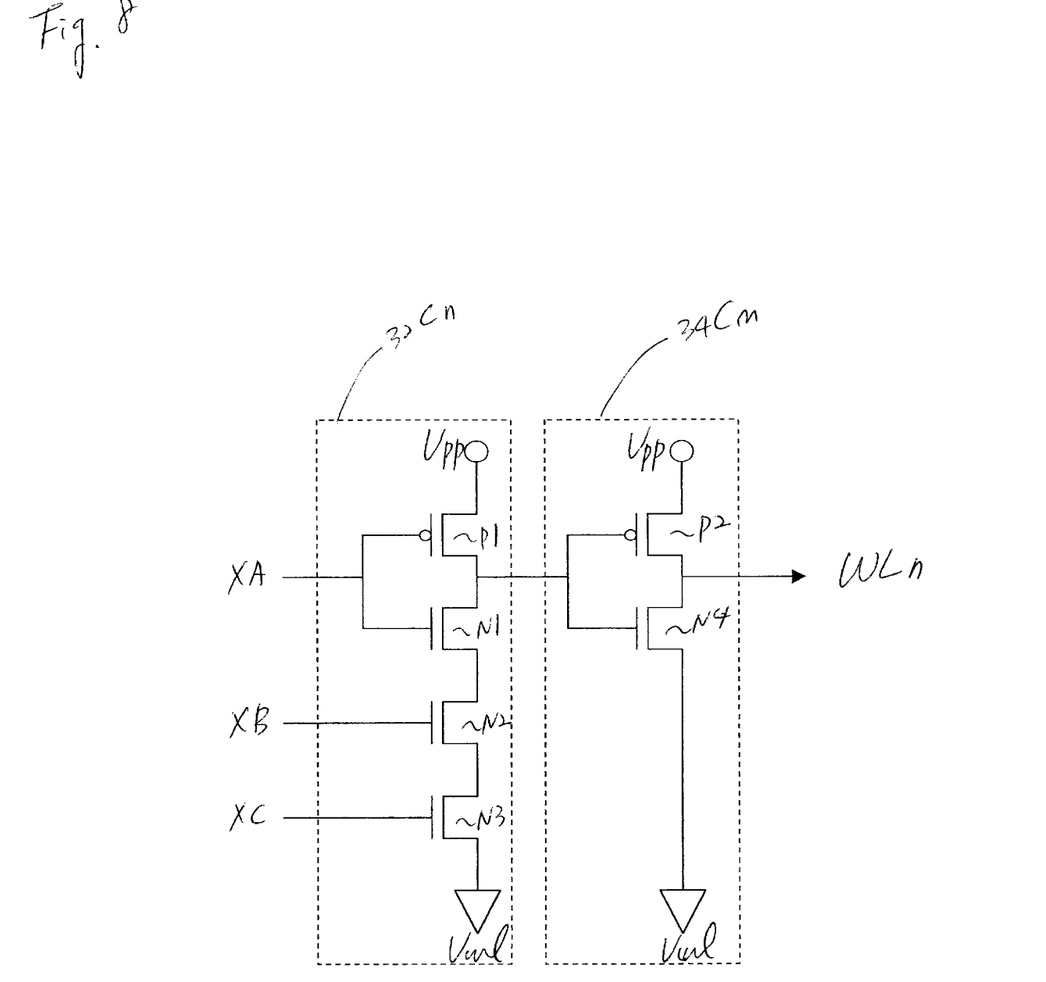
FIG. 8 depicts a circuit diagram of a row decoder unit and a row driver unit of FIG. 6, in accordance with an embodiment of the present invention.

FIG. 8 depicts a circuit diagram of a row decoder 32Cn and a word line driver 34Cn provided within the row decoder unit 32C and the word line driver unit 34C of the memory bank 3. The row decoder 32Cn includes the first PMOS transistor P1 and the first, second and third NMOS transistors N1, N2, N3 connected in series and coupled between a power supply Vpp and ground Vw1 The control gates of the first PMOS transistor P1 and the first NMOS transistor N1 is interconnected to receive the first row selection signal bit XA. The control gates of the second and third NMOS transistors N2, N3 receive the second, third row selection signal bits XB and XC, respectively. An output node of the row decoder 32Cn is located between the first PMOS transistor P1 and the first NMOS transistor N1.

The word line driver 34Cn includes the second PMOS transistor P2 and the fourth NMOS transistor N4 connected in series and coupled between the power supply Vpp and the ground Vw1. The control gates of the second PMOS transistor P2 and the fourth NMOS transistor N4 are connected to the output node of the row decoder 32Cn.

The first, second and third row selection signal bits XA, XB, XC are decoded from the eight-bit row selection signal from the register unit 30C. Particularly, the first row selection signal bit XA is derived from the three least significant bits, the second row selection signal bit XB is derived from the fourth and fifth most significant bits, and the third row selection signal bit XC is derived from the three most significant bits of the eight-bit row selection signal.

The five most significant bits of the row selection signal are used to divide the 256 word lines in the bank 3 into thirty two word line groups, of which each group consisting of eight word lines. Thus, only when the word line WLn belongs to the certain group selected by the five most significant bits of the row selection signal, the second and third NMOS transistors N2, N3 are turned on.

To select one of the eight word lines in the selected word line group, the three least significant bits of the row selection signals are decoded to selectively turn off the pull-on transistor PMOS P1 and turn on the pull-off transistor NMOS N1. Thus, only when all of the row selection signals bits XA, XB, XC are in a "high" level, any potential charge in the row decoder 32Cn is drained to the ground Vw1 via the first, second and third NMOS transistors N1, N2, N3. This discharged potential value (i.e., a "low" level) is transferred via the output node of the row decoder 32Cn to the word line driver 34Cn. The pull-on PMOS transistor P2 is turned on by the discharged potential value from the row decoder 32cn, and the word line Wln is charged to the VPP level while the pull-off NMOS transistor N4 is turned off.

The present invention can be used for a decoding scheme for simultaneously executing read/write/refresh operations within the same memory bank group. When an MPU issues a command to execute a refresh operation, the refresh bank address and refresh address are transferred via the read bank address bus and the read address bus because only the MPU needs to know whether it is a read or refresh operation. Thus, for example, in FIG. 5, either write and refresh operations or write and read operations can be simultaneously executed in two different memory banks in the same memory bank group.

Also, according to the present invention, it is possible to execute more than two operations by providing two separate read bank address buses and two separate read address to simultaneously execute two different read operations in two different memory banks. Also, by providing two separate write bank address buses and two separate write bank address buses, two different writing operation can be simultaneously executed in two different memory banks.

In view of the foregoing, it is seen that the present invention enables simultaneously executing multiple operations in a memory bank group having memory banks stacked one another by providing a decoding unit which can simultaneously provides a read bank address and a read row address to one bank and a write bank address and a write row address to another bank. Thus, present invention significantly reduces operation response time in a multi-bank DRAM having a stacked-bank architecture.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A semiconductor memory device comprising:
   a plurality of memory bank groups, each memory bank group of said plurality of memory bank groups comprising a plurality of memory banks arranged in a stacked-bank architecture;
   an address bus transferring read/write bank addresses and read/write addresses for locations in one or more memory banks for read/write operations;
   a plurality of decoding units provided corresponding to said plurality of memory bank groups, each decoding unit transferring said read/write addresses to said at least two memory banks if said read/write bank addresses match said at least two memory banks;
   wherein said address bus comprises a global address bus for transferring said read/write bank addresses and read/write addresses for said read/write operations and a plurality of local address buses provided corresponding to said plurality of decoding units, each coupled between said global address bus and the corresponding decoding unit and transferring said read/write bank addresses and read/write addresses to said decoding units, and
   wherein said read and write operations may be simultaneously performed in at least two respective memory banks of said each memory bank group.

2. The semiconductor memory device of claim 1, wherein each decoding unit simultaneously transfers said read/write addresses to said at least two memory banks if said read/write bank addresses match said at least two memory banks.

3. The semiconductor memory device of claim 2, said global address bus comprising:
   a global read bank address bus transferring said read bank address for said read operation;
   a global write bank address bus transferring said write bank address for said write operation;
   a global read address bus transferring a row address of said memory bank matching said read bank address for said read operation; and a global write address bus transferring a row address of said memory bank matching said write bank address for said write operation.

4. The semiconductor memory device of claim 3, each local address bus comprising:
   a local read bank address bus coupled between said global read bank address bus and said corresponding decoding unit, and transferring said read bank address;
   a local write bank address bus coupled between said global write bank address and said corresponding decoding unit, and transferring said write bank address;
   a local read address bus coupled between said global read address bus and said corresponding decoding unit, and transferring said row address for said read operation; and
   a local write address bus coupled between said global write address bus and said corresponding decoding unit, and transferring said row address for said write operation.

5. The semiconductor memory device of claim 4, each of said plurality of decoding units comprising a plurality of register units provided corresponding to said plurality of memory banks of each memory bank group, each register unit generating a row selection signal for either said read operation or said write operation if one of said read/write bank addresses matches said corresponding bank.

6. The semiconductor memory device of claim 5, wherein each register unit comprises a plurality of multiplexing units, each multiplexing unit receiving said read/write bank addresses and said read/write addresses and generating a row selection bit signal, wherein said row selection signal comprises a combination of said row selection bit signals from said plurality of multiplexing units of the same register unit.

7. The semiconductor memory device of claim 6, wherein said row selection signal is provided to a row decoder block of said corresponding memory bank to selectively activate a row of said corresponding memory bank.

8. The semiconductor memory device of claim 7, wherein said row decoder block comprising:
   a plurality of row decoders provided corresponding to a plurality of word lines in said corresponding memory bank, each row decoder receiving said row selection signal from said register unit and generating a row activation signal if said row selection signal matches said corresponding row; and
   a plurality of word line drivers provided corresponding to said plurality of row decoders, each word line driver activating said corresponding word line based on said row activation signal from said corresponding row decoder.

9. The semiconductor memory device of claim 8, each multiplexing unit comprising:
   a latch unit generating said row selection bit signal;
   a precharge means for preconditioning the latch unit;
   a first decoding means for decoding said read bank address and read address; and
   a second decoding path for decoding said write bank address and write bank addresses.

10. The semiconductor memory device of claim 9, wherein said latch unit comprising:
   a first inverter having input/output terminals;
   a second inverter having input/output terminals;
   a first interconnection line interconnecting the output terminal of said first inverter and the input terminal of said second inverter;
   a second interconnection line interconnecting the output terminal of said second inverter to the input terminal of said firs t inverter; and
   an output node formed on said first interconnection line and generating said row selection bit signal.

11. The semiconductor memory device of claim 10, wherein said precharge means comprising a first voltage source connected to a first node formed on said second interconnection line via a first switching means, wherein said first switching means having a control electrode connected to a precharge signal line.

12. The semiconductor memory device of claim 11, wherein said first decoding means comprising:
   a second switch coupled between a second node formed between said first node and said input terminal of said first inverter and a third node, and having a control electrode connected to said local read bank address bus;
   a third switch coupled between said third node and a second voltage source, and having a control electrode connected to said local read address bus.

13. The semiconductor memory device of claim 12, wherein said second decoding means comprising:
   a fourth switch coupled between a fourth node formed between said first node and said output terminal of said second inverter and a fifth node, and having a control electrode connected said local write bank address bus; and
   a fifth switch coupled between said fifth node and said second power source, and having a control electrode connected to said local write address bus.

14. The semiconductor memory device of claim 2, wherein said read bank address and said read address are utilized to execute a refresh operation so that either said read/write operations or said refresh/write operations are simultaneously executed within each memory bank group.

15. A semiconductor memory device comprising:
   a plurality of memory bank groups, each group comprising a plurality of memory banks arranged in a stacked-bank architecture;
   an address bus transferring read/write bank addresses and read/write addresses for locations in one or more memory banks of a memory bank group for read/write/refresh operations; and
   a plurality of decoding units provided corresponding to said plurality of memory bank groups, each decoding unit transferring said read/write addresses to said at least two memory banks if said read/write bank addresses match said at least two memory banks;
   wherein said address bus comprises a global address bus for transferring said read/write bank addresses and read/write addresses for said read/write operations and a plurality of local address buses provided corresponding to said plurality of decoding units, each coupled between said global address bus and the corresponding decoding unit and transferring said read/write bank addresses and read/write addresses to said decoding units, and
   whereby each memory bank group simultaneously executes at least two of said read, write and refresh operations at least two memory banks thereof.

16. The semiconductor memory device of claim 15, wherein each memory bank group simultaneously executes either said read/write operations or said refresh/write operations at least two memory banks thereof.

17. The semiconductor memory device of claim 16, further comprising a plurality of decoding units provided corresponding to said plurality of memory bank groups, each decoding unit simultaneously transferring said read/write addresses to said at least two memory banks if said read/write bank addresses matches said at least two memory banks for said read/write/refresh operations.

19. The semiconductor memory device of claim 17, each of said plurality of decoding units comprising a plurality of register units provided corresponding to said plurality of memory banks of each memory bank group, each register unit generating a row selection signal for either said read operation or said refresh operation if said read bank address matches said corresponding bank and generating a row selection signal for said write operation if said write bank address matches said corresponding bank.

19. The semiconductor memory device of claim 17, each register unit comprising a plurality of multiplexing units, each multiplexing unit receiving said read address and generating a row selection bit signal for said read operation or said refresh operation if said read bank address matches said corresponding bank, and receiving said write address and generate a row selection bit signal for said write operation if said write bank address matches said corresponding bank.

20. An integrated circuit including a memory, said memory including:
   at least one memory bank group comprising a plurality of memory banks including at least a first memory bank and a second memory bank arranged in a stacked-bank architecture;
   an address bus coupled to said first memory bank and to said second memory bank to provide a write address and a read address to any combination of said first and said second memory banks, and to simultaneously transfer a write address to said first memory bank and a read address to said second memory bank, said read address being selected independently from said write address; and
   a plurality of decoding units provided corresponding to a plurality of said at least one memory bank group, each decoding unit transferring said read and write addresses to at least two memory banks of said plurality of memory banks if read and write bank addresses match said at least two memory banks;
   wherein said address bus comprises a global address bus for transferring said read and write bank addresses and said read and write addresses for read/write operations and a plurality of local address buses provided corresponding to said plurality of decoding units, each coupled between said global address bus and the corresponding decoding unit and transferring said read and write bank addresses and said read and write addresses to said decoding units;
   whereby, a write operation in said first memory bank may be performed simultaneously with an independent read operation in said second memory bank.

21. The integrated circuit of claim 20 wherein said memory bank group comprises a number n of memory banks, and said address bus includes a number m read paths and said number m write paths, 2m being less than or equal to n, such that said address bus is adapted to simultaneously transfer, one of m independently selected read addresses to each of m said memory banks and one of m independently selected write addresses to each of m other said memory banks, whereby m read operations and m write operations may be performed simultaneously in each of said 2m memory banks.

22. The integrated circuit of claim 21 wherein at least one of said read addresses and said write addresses are adapted to access and refresh stored data in memory locations of said memory bank group, whereby 2m operations being any of read, write or refresh may be performed simultaneously in each of said 2m memory banks.

23. A semiconductor memory device comprising:
   a plurality of memory bank groups, each group comprising a plurality of memory banks arranged in a stacked-bank architecture;
   an address bus transferring read/write bank addresses and read/write addresses for locations in one or more memory banks of a memory bank group for read/write/refresh operations; and
   a plurality of decoding units provided corresponding to said plurality of memory bank groups, each decoding unit simultaneously transferring said read/write addresses to said at least two memory banks if said read/write bank addresses matches said at least two memory banks for said read/write/refresh operations, each of said plurality of decoding units comprising a plurality of register units provided corresponding to said plurality of memory banks of each memory bank group, each register unit generating a row selection signal for either said read operation or said refresh operation if said read bank address matches said corresponding bank and generating a row selection signal for said write operation if said write bank address matches said corresponding bank;
   wherein each memory bank group simultaneously executes at least one of (i) two of said read, write and refresh operations at least two memory banks thereof and (ii) either said read/write operations or said refresh/write operations at least two memory banks thereof.

24. A semiconductor memory device comprising:
   a plurality of memory bank groups, each group comprising a plurality of memory banks arranged in a stacked-bank architecture;
   an address bus transferring read/write bank addresses and read/write addresses for locations in one or more memory banks of a memory bank group for read/write/refresh operations; and
   a plurality of decoding units provided corresponding to said plurality of memory bank groups, each decoding unit simultaneously transferring said read/write addresses to said at least two memory banks if said read/write bank addresses match said at least two memory banks for said read/write/refresh operations, each of said plurality of decoding units comprising a plurality of register units, each register unit comprising a plurality of multiplexing units, each multiplexing unit receiving said read address and generating a row selection bit signal for said read operation or said refresh operation if said read bank address matches said corresponding bank, and receiving said write address and generate a row selection bit signal for said write operation if said write bank address matches said corresponding bank;
   wherein each memory bank group simultaneously executes at least one of (i) two of said read, write and refresh operations at least two memory banks thereof and (ii) either said read/write operations or said refresh/write operations at least two memory banks thereof.

25. An integrated circuit including a memory, said memory including:
   at least one memory bank group comprising a plurality of memory banks including at least a first memory bank and a second memory bank arranged in a stacked-bank architecture, said memory bank group comprises a number n of memory banks; and an address bus coupled to said first memory bank and to said second memory bank to provide a write address and a read address to any combination of said first and said second memory banks, and to simultaneously transfer a write address to said first memory bank and a read address to said second memory bank, said read address being selected independently from said write address, said address bus includes a number m read paths and said number m write paths, 2m being less than or equal to n, such that said address bus is adapted to simultaneously transfer, one of m independently selected read addresses to each of m said memory banks and one of m independently selected write addresses to each of m other said memory banks, whereby m read operations and m write operations may be performed simultaneously in each of said 2m memory banks, and whereby a write operation in said first memory bank may be performed simultaneously with an independent read operation in said second memory bank.

\* \* \* \* \*